(12) United States Patent
Ko et al.

(10) Patent No.: US 9,893,018 B2
(45) Date of Patent: Feb. 13, 2018

(54) ALIGNMENT MARK FOR SEMICONDUCTOR DEVICE

(71) Applicants: Yeong-Kwon Ko, Suwon-si (KR);
 Tae-Hyeong Kim, Suwon-si (KR);
 Ji-Hwang Kim, Cheonan-si (KR);
 Sun-Kyoung Seo, Suwon-si (KR);
 Tae-Je Cho, Yongin-si (KR)

(72) Inventors: Yeong-Kwon Ko, Suwon-si (KR);
 Tae-Hyeong Kim, Suwon-si (KR);
 Ji-Hwang Kim, Cheonan-si (KR);
 Sun-Kyoung Seo, Suwon-si (KR);
 Tae-Je Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/712,382

(22) Filed: May 14, 2015

(65) Prior Publication Data
 US 2016/0056113 A1    Feb. 25, 2016

(30) Foreign Application Priority Data
 Aug. 20, 2014  (KR) .......................... 10-2014-0108496

(51) Int. Cl.
 *H01L 23/544* (2006.01)
 *H01L 25/065* (2006.01)
 (Continued)

(52) U.S. Cl.
 CPC ........ *H01L 23/544* (2013.01); *B23K 26/0057* (2013.01); *H01L 25/0657* (2013.01);
 (Continued)

(58) Field of Classification Search
 CPC ... H01L 2223/54426; H01L 2223/5446; H01L 2225/06593; H01L 2223/5448; B23K 26/0063; B23K 26/0057
 See application file for complete search history.

(56) References Cited

U.S. PATENT DOCUMENTS 8,043,927 B2   10/2011  Park et al.
2006/0027809 A1*  2/2006  Ogawa .................. H01L 21/268
                                                         257/66

(Continued)

FOREIGN PATENT DOCUMENTS

JP    2009-027318 A    2/2009
JP    2012-028664 A    2/2012

(Continued)

*Primary Examiner* — Daniel Luke
(74) *Attorney, Agent, or Firm* — Harness, Dickey & Pierce, P.L.C.

(57) ABSTRACT

Semiconductor devices and methods for manufacturing a semiconductor device include a first semiconductor substrate in which a first scribe line region and a first chip region are defined, a first alignment mark inside the first semiconductor substrate and in the first scribe line region so as to be spaced apart from an upper side of the first semiconductor substrate, a second semiconductor substrate on the first semiconductor substrate and in which a second scribe line region and a second chip region are defined, and a second alignment mark inside the second semiconductor substrate and in the second scribe line region so as to be spaced apart from an upper side of the second semiconductor substrate, wherein the second semiconductor substrate is on the first semiconductor substrate so that positions of the first alignment mark and the second alignment mark correspond to each other.

18 Claims, 16 Drawing Sheets

(51) Int. Cl.
*B23K 26/00* (2014.01)
*H01L 21/768* (2006.01)

(52) U.S. Cl.
CPC .............. *H01L 21/76898* (2013.01); *H01L 2223/5442* (2013.01); *H01L 2223/5446* (2013.01); *H01L 2223/5448* (2013.01); *H01L 2223/54426* (2013.01); *H01L 2224/16225* (2013.01); *H01L 2225/06541* (2013.01); *H01L 2225/06593* (2013.01)

(56) References Cited

U.S. PATENT DOCUMENTS

| | | | | |
|---|---|---|---|---|
| 2008/0220553 | A1* | 9/2008 | Park | G02F 1/133351 438/30 |
| 2009/0075457 | A1* | 3/2009 | MacHida | H01L 23/3114 438/462 |
| 2009/0121337 | A1 | 5/2009 | Abe et al. | |
| 2009/0316127 | A1 | 12/2009 | Furui | |
| 2010/0092599 | A1* | 4/2010 | Selinidis | B82Y 10/00 425/470 |
| 2011/0156284 | A1* | 6/2011 | Zhang | H01L 22/34 257/797 |
| 2011/0291246 | A1* | 12/2011 | Jo | H01L 24/81 257/621 |
| 2011/0306191 | A1* | 12/2011 | Ohi | H01L 29/0634 438/495 |
| 2014/0030867 | A1* | 1/2014 | Kim | H01L 21/027 438/401 |
| 2014/0038337 | A1 | 2/2014 | Pyo | |
| 2014/0353852 | A1* | 12/2014 | Hauck | H01L 23/544 257/797 |
| 2015/0137358 | A1* | 5/2015 | Yanagisawa | H01L 23/481 257/737 |

FOREIGN PATENT DOCUMENTS

| | | |
|---|---|---|
| KR | 10-0509422 B1 | 8/2005 |
| KR | 2012-0068302 A | 6/2012 |
| KR | 10-1356216 B1 | 1/2014 |

* cited by examiner

<u>3</u>

ALIGNMENT MARK FOR SEMICONDUCTOR DEVICE

CROSS-REFERENCE TO RELATED APPLICATIONS

This application is based on and claims the benefit of, and priority, under 35 U.S.C. § 119, to Korean Patent Application No. 10-2014-0108496, filed on Aug. 20, 2014 in the Korean Intellectual Property Office, the disclosure of which is incorporated herein in its entirety by reference.

BACKGROUND

1. Field

Example embodiments of the present inventive concepts relate to semiconductor devices and methods for manufacturing the same.

2. Description of the Related Art

As a packaging technology of a semiconductor integrated circuit, a three-dimensional (3D) multilayer technology can heighten packaging density while reducing the size of an electronic element and can improve the performance of the semiconductor integrated circuit. A package using such a 3D multilayer technology is a package in which a plurality of chips having the same storage capacity are stacked, and is generally called a stack package. In the stack package, the data storage capacity can be easily increased, but the stack package has insufficient wiring space for electrical connections in the package as the number of stacked chips and the size thereof are increased.

Due to the insufficient wiring space in the stack package, a structure using a through silicon via (TSV) has been proposed, and recently, a method has been used to form a through electrode that is made of a conductive material in a semiconductor chip and to electrically connect semiconductor chips through the through electrode.

If the through electrode is used, it is possible to bond fine pitch I/O pads to cause the number of I/O pads to be increased, to improve the signal transfer speed between the chips through forming of the plurality of I/O pads, and to perform 3D design of the semiconductor chip to cause the performance of the semiconductor chip itself to be further improved.

On the other hand, the through silicon via (TSV) is formed through via first, via middle, and via last processes, which are classified depending on when the via is formed. Here, the "via last process" is general terminology for methods for forming via in a wafer state where the wafer fabrication has been completed, and the via last process is further divided into two processes: via last from frontside and via last from backside.

The via last from backside has mainly been used because it can reduce a via pitch, and has a simple process at low cost and high degrees of freedom.

However, a mask pattern for forming the via is formed on the back side of the wafer during the via last from backside, and in this case, misalignment may occur between a wafer backside portion that is exposed by the mask pattern and a pad that is formed on the frontside portion of the wafer. If such misalignment occurs, the via that is formed from the backside of the wafer is unable to be formed to expose the pad that is formed on the frontside of the waver, and as a result, the through electrode that is formed in the via is unable to be electrically connected to the semiconductor chip.

SUMMARY

Example embodiments of the present inventive concepts relate to semiconductor devices and methods for manufacturing the same.

One object to be solved by example embodiments of the present inventive concepts is to provide methods for fabricating a semiconductor device, which forms an alignment key in a chip using laser so as to simplify a backside alignment process and to improve process accuracy when the backside alignment process is performed with respect to a wafer. In particular, in the backside alignment process with respect to the wafer, the processing steps can be greatly reduced in comparison to the case of using a lithography process, and thus the processing cost can be reduced.

Another object to be solved by example embodiments of the present inventive concepts is to provide semiconductor devices, in which an alignment key is formed in a chip using laser so as to simplify a backside alignment process with respect to a wafer and to improve process accuracy.

In one aspect of example embodiments of the present inventive concepts, there is provided a semiconductor device including a first semiconductor substrate in which a first scribe line region and a first chip region are defined, a first alignment mark inside the first semiconductor substrate and in the first scribe line region so as to be spaced apart from an upper side of the first semiconductor substrate, a second semiconductor substrate on the first semiconductor substrate and in which a second scribe line region and a second chip region are defined, and a second alignment mark inside the second semiconductor substrate and in the second scribe line region so as to be spaced apart from an upper side of the second semiconductor substrate, wherein the second semiconductor substrate is on the first semiconductor substrate so that positions of the first alignment mark and the second alignment mark correspond to each other.

The first and second semiconductor substrates may include silicon.

The first and second alignment marks may be in an amorphous state.

The first and second alignment marks may be formed by respectively irradiating the first and second semiconductor substrates with a laser.

The semiconductor device may further include a third alignment mark on a side of the first semiconductor substrate facing the second semiconductor substrate.

The third alignment mark may be formed in a position that corresponds to the position of the first alignment mark.

An outline of the third alignment mark may be positioned within and about 3.75 μm from an outline of the first alignment mark.

The semiconductor device may further include a circuit structure inside the second semiconductor substrate of the second chip region.

The semiconductor device may further include a through via structure inside the second semiconductor substrate of the second chip region.

The first alignment mark or the second alignment mark may be shaped in the form of a cross.

In another aspect of example embodiments of the present inventive concepts, there is provided a semiconductor device including a semiconductor chip including a scribe line region, and a first alignment mark inside the semiconductor chip and in the scribe line region so as to be spaced apart from an upper side of the semiconductor chip.

In still another aspect of example embodiments of the present inventive concepts, there is provided a method for fabricating a semiconductor device including preparing a semiconductor substrate in which a scribe line region and a chip region are defined, and forming a first alignment mark in the semiconductor substrate and in the scribe line region so as to be spaced apart from an upper side of the semiconductor substrate by irradiating the scribe line region with beams.

The semiconductor device may further include a second alignment mark in a position corresponding to a position of the first alignment mark and on a lower side of the semiconductor chip, wherein the lower side and the upper side oppose each other.

The semiconductor chip may include silicon.

The semiconductor chip may be in a crystalline state, and the first alignment mark may be in an amorphous state.

The first alignment mark may be shaped in the form of a cross.

An outline of the second alignment mark may be positioned within about 3.75 μm from an outline of the first alignment mark.

According to example embodiments, a semiconductor device includes a semiconductor layer including at least one scribe line region delimiting a side of at least one chip region, and an alignment mark within the semiconductor layer so as to be spaced apart from a first surface of the semiconductor layer on which semiconductor chips are to be formed.

A solid state of the semiconductor layer may be different than a solid state of the alignment mark.

The solid state of the alignment mark may be crystalline, polycrystalline or amorphous.

According to still other example embodiments, a method of forming a semiconductor device includes providing a semiconductor substrate including adjacent chip regions; and forming an alignment mark within the semiconductor substrate by changing a solid state of a portion of the semiconductor substrate between the adjacent chip regions.

The changing the solid state of the portion of the semiconductor substrate may include irradiating or annealing the portion of the semiconductor substrate.

The solid state of the portion of the semiconductor substrate between the adjacent chip regions may be different than a solid state of a remainder of semiconductor substrate.

The semiconductor substrate may include a scribe line region, and a position of the alignment mark may correspond to the scribe line region.

The forming the alignment mark within the semiconductor substrate may include irradiating the scribe line region. The forming an alignment mark may include using a laser.

The method may further include performing a sawing process, wherein the sawing process includes removing a part of the alignment mark such that the adjacent chip regions are separated.

BRIEF DESCRIPTION OF THE DRAWINGS

Example embodiments will be more clearly understood from the following detailed description taken in conjunction with the accompanying drawings.

FIG. 1 is a view schematically illustrating an apparatus for producing an alignment mark according to example embodiments of the present inventive concepts;

FIG. 2 is a view schematically illustrating a cross section of a wafer on which an alignment mark is formed according to example embodiments of the present inventive concepts;

FIG. 3 is a flowchart sequentially illustrating a process of forming a semiconductor package using an alignment mark according to example embodiments of the present inventive concepts;

FIG. 4 is a schematic cross-sectional view of a semiconductor device according to example embodiments of the present inventive concepts;

FIG. 5 is a plan view illustrating the shape of an alignment mark;

FIG. 6 is a view explaining a region in which an alignment mark is formed;

FIG. 7 is a schematic cross-sectional view of a semiconductor device according to other example embodiments of the present inventive concepts;

FIG. 8 is a view explaining a region where an alignment mark is formed;

FIG. 9 is a schematic cross-sectional view of a semiconductor device according to still other example embodiments of the present inventive concepts;

FIG. 10 is a schematic cross-sectional view of a semiconductor device according to still other example embodiments of the present inventive concepts;

FIG. 11 is a flowchart sequentially illustrating a method for fabricating a semiconductor device according to example embodiments of the present inventive concepts;

FIG. 12 is a flowchart sequentially illustrating a method for fabricating a semiconductor device according to other example embodiments of the present inventive concepts;

FIG. 13 is a flowchart sequentially illustrating a method for fabricating a semiconductor device according to still other example embodiments of the present inventive concepts;

FIG. 14 is a block diagram of an electronic system including a semiconductor device fabricated according to example embodiments of the present inventive concepts; and FIGS. 15 and 16 are plan and perspective views illustrating a semiconductor system to which a semiconductor device fabricated according to some example embodiments of the present inventive concepts can be applied.

DETAILED DESCRIPTION OF EXAMPLE EMBODIMENTS

Figure 1:
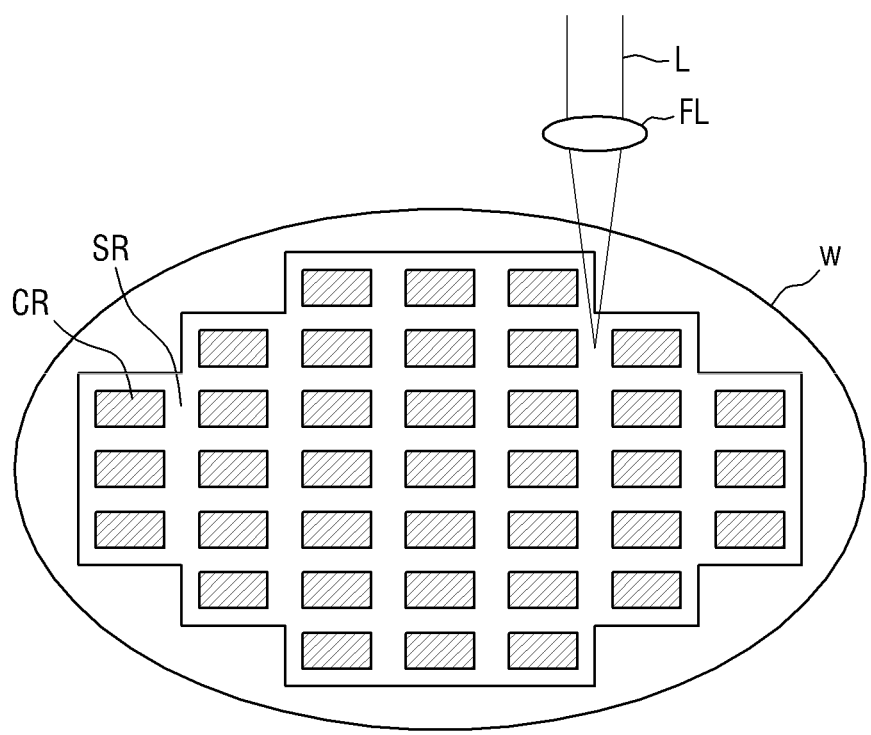
FIGS. 1-16 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In order to more specifically describe example embodiments, various features will be described in detail with reference to the attached drawings. However, example embodiments described are not limited thereto.

Example embodiments of the present inventive concepts relate to semiconductor devices and methods for manufacturing the same.

Hereinafter, a semiconductor device will be described, in which an alignment mark is formed on a scribe line of a wafer using laser. According to example embodiments of the present inventive concepts, a backside alignment process is simplified by adopting a laser process in a WSS (Wafer Support System) process, and a self-align key can be formed in a backside pad process. Accordingly, alignment accuracy can be improved, and processing cost can be reduced. Further, according to laser arrangement, a GAL (Grinding After Layer) process can be performed in a TWS (Thin Wafer Sawing) process.

Figure 2:
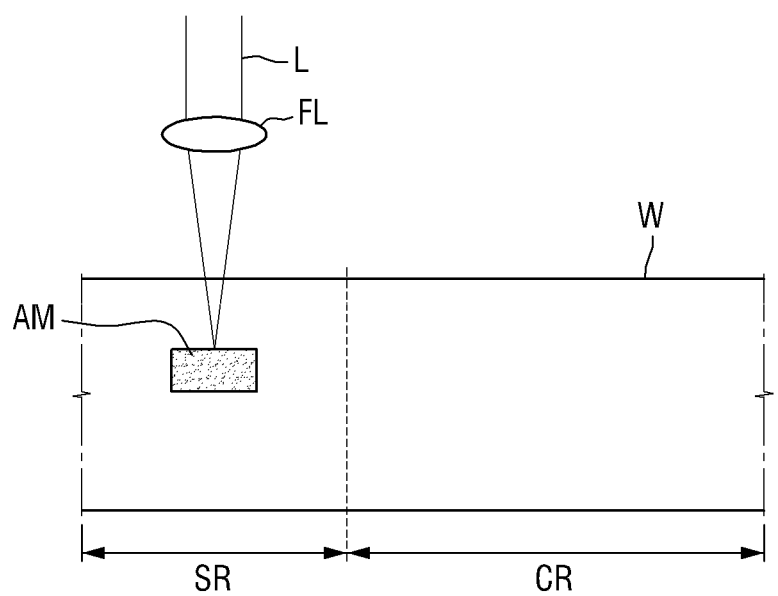
Figure 3:
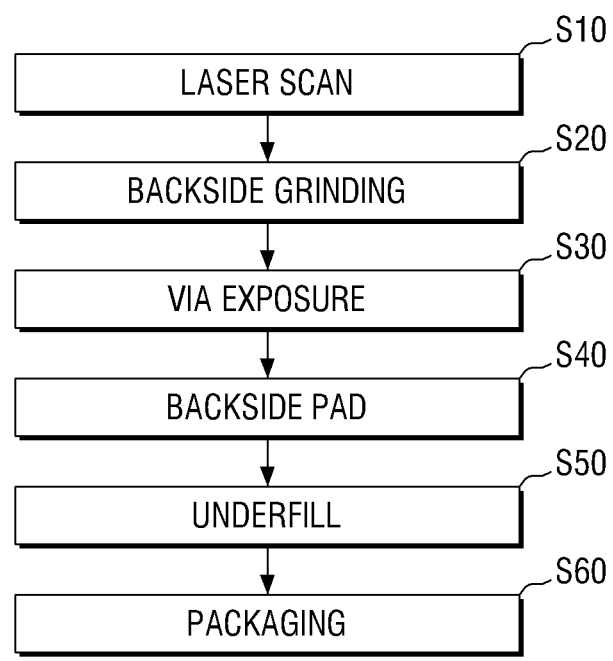

FIG. 1 is a view schematically illustrating an apparatus for producing an alignment mark according to example embodiments of the present inventive concepts, and FIG. 2 is a view schematically illustrating a cross section of a wafer on which an alignment mark is formed according to example embodiments of the present inventive concepts. FIG. 3 is a flowchart sequentially illustrating a process of forming a semiconductor package using an alignment mark according to example embodiments of the present inventive concepts.

Referring to FIGS. 1 and 2, an apparatus for producing an alignment mark according to example embodiments of the present inventive concepts will be described.

Referring to FIGS. 1 and 2, with respect to a wafer W in which a scribe line region SR and a chip region CR are defined, an alignment mark AM is formed inside (or within) the wafer W of the scribe line region SR using laser L.

A plurality of semiconductor chips are formed on the wafer W. That is, semiconductor chips are formed on a plurality of chip regions CR, and a region that partitions the plurality of semiconductor chips is the scribe line region SR. In order to form a largest number of semiconductor chips on one wafer W, the plurality of semiconductor chips may be formed to be arranged, for example, in a matrix form. In the subsequent process, the scribe line region SR is cut to separate the plurality of semiconductor chips from each other.

In this case, the alignment mark AM that is formed in the scribe line region SR may be partially removed, but the alignment mark AM that is formed adjacent to the chip region CR may remain without being removed.

In the related art, for a backside alignment process, a lithography process is performed, a recess is formed by performing an etching process, and the formed recess is used as an alignment key. In this case, the processing steps are increased, and the processing time and cost are increased. According to example embodiments of the present inventive concepts, in order to solve this problem, a separate alignment key is not formed on the backside of the wafer, but an alignment mark is formed inside the semiconductor substrate. The formed alignment mark may be used as an alignment key in the backside alignment process.

That is, the alignment mark can be used as the alignment key using the recognition difference in illumination and brightness between the semiconductor substrate and the alignment mark formed inside the semiconductor substrate.

Using this method, the backside alignment process can be simplified, the accuracy of the alignment process can be improved, and the processing time and cost can be reduced.

Referring to FIGS. 1 and 2, laser L may be focused using a focusing lens FL, and the alignment mark AM may be formed inside the wafer W of the scribe line region SR through adjustment of the intensity of the laser L. In this case, the alignment mark M may be formed to be spaced apart from the frontside or backside of the wafer W, and may be formed in a position that is spaced apart for about 40 μm from the backside of the wafer W.

In the case of performing a TWS (Thin Wafer Sawing) process to reduce the thickness of the wafer W in the subsequent process, a GAL (Grinding After Layer) process may be used. However, for this, it is necessary to secure a wafer (W) handling margin.

Referring to FIG. 3, a process of forming a semiconductor package using an alignment mark according to example embodiments of the present inventive concepts is schematically illustrated. First, through a laser (L) scanning process, an alignment mark AM is formed inside a wafer W of a scribe line region SR (S10).

In this case, the alignment mark AM is to change a part of a semiconductor material that is included in the wafer W into an amorphous state, and the shape of the alignment mark AM may be formed in various manners through securing of a process margin. For example, the alignment mark AM may be formed in a cross (+) shape. Further, the alignment mark AM may be formed in various shapes, such as "L", "H", and "U" shapes.

Then, a backside grinding process is performed (S20). For example, the alignment mark AM may be formed in a position that is spaced apart for about 40 μm from the backside of the wafer W, and the backside of the wafer W may be ground to secure the process margin so that the alignment mark AM is not exposed.

In this case, the backside of the wafer W may be ground by attaching the wafer W to a wafer carrier. Through such a grinding process, the recognition difference in illumination and brightness between the alignment mark AM and the wafer W may clearly appear.

Further, through the backside grinding process, a through via (TSV) electrode, which is formed in the chip region CR, may be exposed (S30). In order to prevent the alignment mark AM from being exposed as the through via (TSV) electrode is exposed, the alignment mark AM may be formed to be shallower than the forming depth of the through via (TSV) electrode (e.g., the alignment mark AM may be formed so that the alignment mark AM is positioned at a middle depth in the depth direction in which the through via (TSV) electrode is formed).

In the case of using a process of via last from backside of the wafer, the backside of the wafer W may be etched to form a through via hole using the alignment mark AM that is formed according to example embodiments of the present inventive concepts, and the through via electrode may be formed in the through via hole.

Using the alignment mark AM that is formed in the scribe line region SR of the wafer W, misalignment between the through via electrode that is formed from the backside and a pad that is formed on the frontside of the wafer W can be reduced or prevented.

Through this, the through via hole that is formed from the backside of the wafer W may expose the pad that is formed on the frontside of the wafer W, and thus the through via electrode that is formed in the through via may be electrically connected to the semiconductor chip to improve reliability of the product in the case where a semiconductor package is formed.

Then, a backside pad that is used to form the semiconductor package is formed on the backside of the wafer W (S40). The backside pad may be in a position in which a bonding bump (e.g., solder ball) is mounted for electrical connection with another semiconductor chip.

Then, one semiconductor chip and another semiconductor chip are electrically connected to each other, and a semiconductor package is formed by performing an underfill process (S50). Through the underfill process, the semiconductor chips that face each other are stacked with each other by injecting encapsulants so that voids are not produced in a space between the semiconductor chips that face each other. Through this process, a semiconductor package having a 3D multilayer structure can be formed.

In the case of stacking a plurality of semiconductor chips, misalignment between the semiconductor chips can be prevented using the alignment mark AM as described above. The alignment mark AM may be formed in the scribe line region SR for each semiconductor chip, and an alignment process may be performed using the alignment mark AM.

Then, the semiconductor package is formed through a packaging process (S60).

Figure 4:
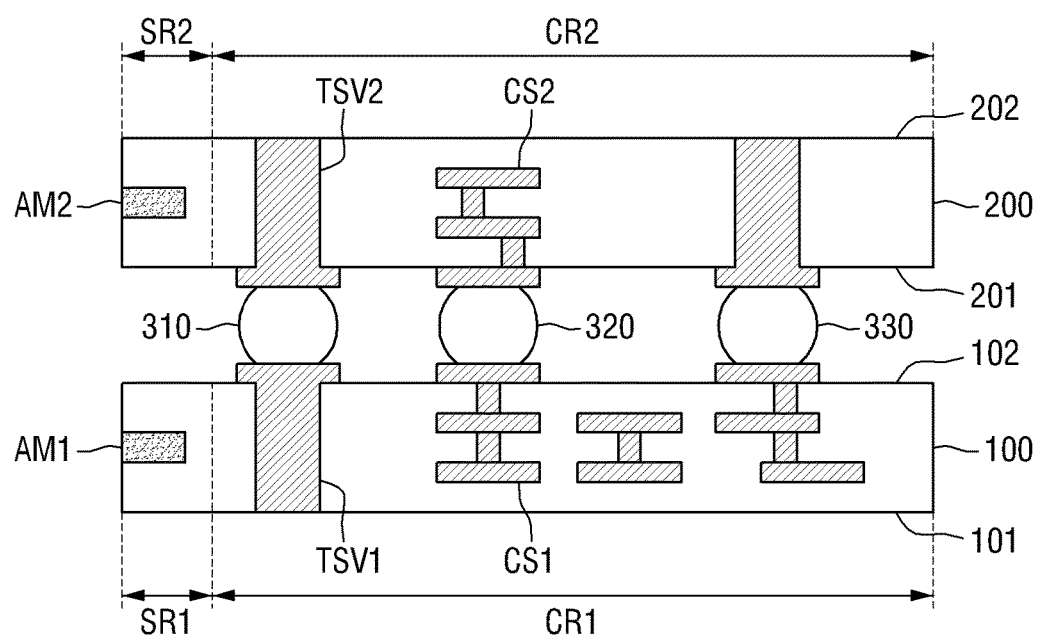
Figure 5:
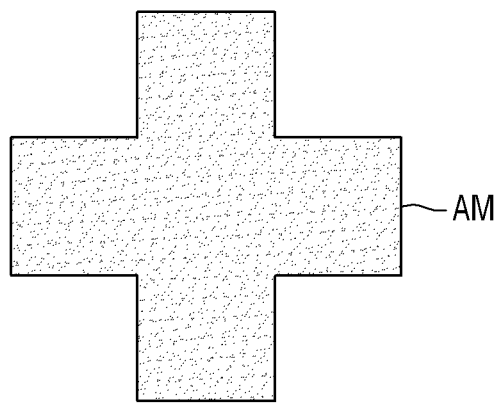
Figure 6:
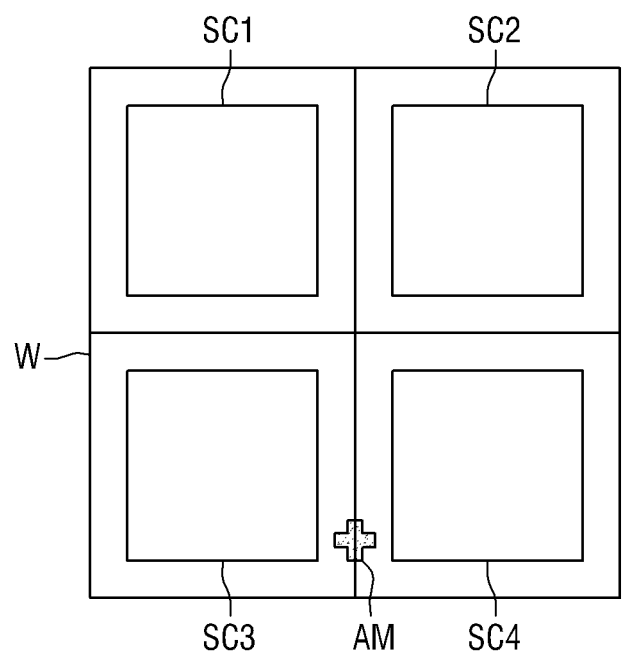

FIG. 4 is a schematic cross-sectional view of a semiconductor device according to example embodiments of the present inventive concepts. FIG. 5 is a plan view illustrating the shape of an alignment mark, and FIG. 6 is a view explaining a region in which an alignment mark is formed.

Referring to FIG. 4, a semiconductor device 1 according to example embodiments of the present inventive concepts includes a first semiconductor substrate 100, a first alignment mark AM1, a second semiconductor substrate 200, a second alignment mark AM2, and bonding bumps 310, 320, and 330.

In the first semiconductor substrate 100, a first scribe line region SR1 and a first chip region CR1 are defined. The first semiconductor substrate 100 may be a semiconductor chip in which, for example, a through via structure TSV1 and a circuit structure CS1 are formed. The first semiconductor substrate 100 may be, for example, a semiconductor chip that is firstly mounted on a base substrate to form a semiconductor package. Here, the semiconductor chip may be an integrated circuit (IC) chip that is variously used.

The first semiconductor substrate 100 may include silicon (Si), but example embodiments of the present inventive concepts are not limited thereto. For example, the first semiconductor substrate 100 may be made of at least one semiconductor material that is selected from the group including Si, Ge, SiGe, GaP, GaAs, SiGeC, InAs, and InP. Further, in some example embodiments of the present inventive concepts, the first semiconductor substrate 100 may be made of SOI (Silicon On Insulator).

The first alignment mark AM1 is formed inside the first semiconductor substrate 100 of the first scribe line region SR1 to be spaced apart from an upper side 102 of the first semiconductor substrate 100. Further, the first alignment mark AM1 is formed inside the first semiconductor substrate 100 of the first scribe line region SR1 to be spaced apart from a lower side 101 of the first semiconductor substrate 100.

That is, because the first alignment mark AM1 is formed inside the first semiconductor substrate 100 of the first scribe line region SR1 using a laser process, the first alignment mark AM1 can be formed without exerting an influence on the surface of the first semiconductor substrate 100. Forming of the first alignment mark AM1 is to make a part of the first semiconductor substrate 100 in an amorphous state. Because the first semiconductor substrate 100 exists in a crystalline state and the first alignment mark AM1 is in an amorphous state, the first alignment mark can be used as an alignment key due to the recognition difference in illumination and brightness between them in the subsequent process.

Although the semiconductor substrate is in a crystalline state and the alignment mark is in an amorphous state according to the example embodiments described herein, one of ordinary skill in the art will appreciate that example embodiments are not limited thereto. That is, the alignment mark and the semiconductor substrate may be in other solid states so long as the alignment mark can be used as the alignment key using the recognition difference in illumination and brightness between the semiconductor substrate and the alignment mark formed inside the semiconductor substrate. For example, the semiconductor substrate may be in a polycrystalline state or amorphous state, and the alignment mark may be in a crystalline state, prior to a process of sawing (described below). After the process of sawing, a process of annealing or irradiating may be performed to transform the semiconductor substrate into a crystalline state.

In a process of sawing the first scribe line region SR1, a part of the first alignment mark AM1 may be removed, but the first alignment mark AM1 that is formed adjacent to the first chip region CR1 may remain without being removed.

The second semiconductor substrate 200 is mounted on the first semiconductor substrate 100. In the second semiconductor substrate 200, a second scribe line region SR2 and a second chip region CR2 are defined. The second semiconductor substrate 200 may be a semiconductor chip in which, for example, a through via structure TSV2 and a circuit structure CS2 are formed. The second semiconductor substrate 200 may be, for example, a semiconductor chip that is mounted on the first semiconductor substrate 100 to form a semiconductor package. Here, the semiconductor chip may be an integrated circuit (IC) chip that is variously used.

The second semiconductor substrate 200 may include silicon (Si), but example embodiments of the present inventive concepts are not limited thereto. For example, the second semiconductor substrate 200 may be made of at least one semiconductor material that is selected from the group including Si, Ge, SiGe, GaP, GaAs, SiGeC, InAs, and InP. Further, in some example embodiments of the present inventive concepts, the second semiconductor substrate 200 may be made of SOI (Silicon On Insulator).

The second semiconductor substrate 200 may be formed to be separated from the first semiconductor substrate 100 on one wafer. That is, because a plurality of semiconductor chips are formed on one wafer, the second semiconductor substrate 200 and the first semiconductor substrate 100 may be semiconductor chips which are formed on one wafer and then separated from each other in a scribe line cutting process.

The second alignment mark AM2 is formed inside the second semiconductor substrate 200 of the second scribe line region SR2 to be spaced apart from an upper side 202 of the second semiconductor substrate 200. Further, the second alignment mark AM2 is formed inside the second semiconductor substrate 200 of the second scribe line region SR2 to be spaced apart from a lower side 201 of the second semiconductor substrate 200.

That is, because the second alignment mark AM2 is formed inside the second semiconductor substrate 200 of the second scribe line region SR2 using a laser process, the second alignment mark AM2 can be formed without exerting an influence on the surface of the second semiconductor substrate 200. Forming of the second alignment mark AM2 is to make a part of the second semiconductor substrate 200 in an amorphous state. Because the second semiconductor substrate 200 exists in a crystalline state and the second alignment mark AM2 is in an amorphous state, the second alignment mark can be used as an alignment key due to the recognition difference in illumination and brightness between them in the subsequent process.

In a process of sawing the second scribe line region SR2, a part of the second alignment mark AM2 may be removed, but the second alignment mark AM2 that is formed adjacent to the second chip region CR2 may remain without being removed.

The second semiconductor substrate 200 may be mounted on the first semiconductor substrate 100 so that the second alignment mark AM2 corresponds to the position of the first alignment mark AM1. That is, when the second semiconductor substrate 200 is mounted on the first semiconductor substrate 100 in the semiconductor packaging process, the first alignment mark AM1 and the second alignment mark AM2 may be used as alignment keys.

The bonding bumps 310, 320, and 330 are formed to electrically connect the first semiconductor substrate 100 and the second semiconductor substrate 200 to each other. The bonding bumps 310, 320, and 330 may be, for example, solder balls or conductive bumps, but example embodiments of the present inventive concepts are not limited thereto.

FIG. 5 illustrates a shape of an alignment mark. The alignment mark AM that is formed in the scribe line region of the wafer may be in a cross (+) shape. However, example embodiments of the present inventive concepts are not limited thereto. The alignment mark AM may be in various shapes, such as "L", "H", and "U" shapes.

The alignment mark AM may be formed in the scribe line region of the wafer with a target shape that is intended by a user through securing of the process margin in the laser process. In forming the alignment mark AM in various shapes, the alignment mark AM may be formed with a width that is maximally adjacent to the width of the scribe line region so that the remaining alignment mark AM can be used in an alignment process even after the scribe line region is cut off.

FIG. 6 illustrates a position in which an alignment mark is formed. FIG. 6 illustrates four semiconductor chips SC1, SC2, SC3, and SC4 on the wafer W. The scribe line region is formed to partition the four semiconductor chips SC1, SC2, SC3, and SC4, respectively, and the alignment mark AM may be formed on an edge portion of a corner of the wafer. However, example embodiments of the present inventive concepts are not limited thereto. For convenience, the position in which the alignment mark AM is formed may be changed.

After the semiconductor chips are cut along the scribe line region, a part of the scribe line region may remain in succession to a chip region in which the semiconductor chip is included, and the alignment mark AM that is included in the scribe ling region may separately remain.

Hereinafter, a semiconductor device according to other example embodiments of the present inventive concepts will be described.

Figure 7:
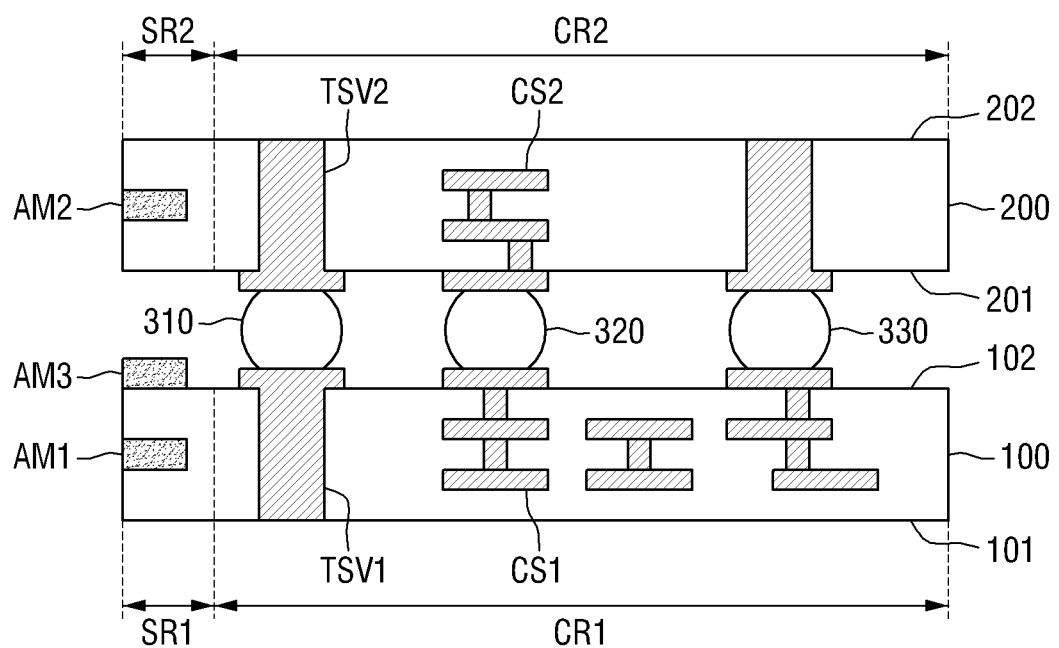
Figure 8:
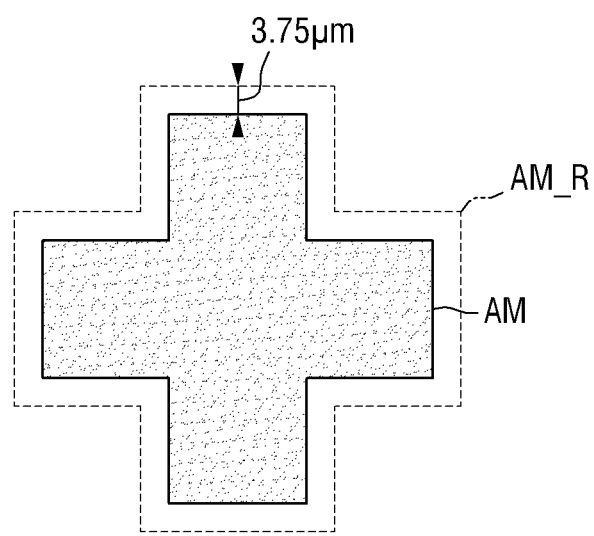

FIG. 7 is a schematic cross-sectional view of a semiconductor device according to other example embodiments of the present inventive concepts, and FIG. 8 is a view explaining a region where an alignment mark is formed.

For convenience in explanation, the explanation of portions that are substantially the same as those of the semiconductor device according to example embodiments of the present inventive concepts shown in FIG. 4 as described above will be omitted.

Referring to FIG. 7, a semiconductor device 2 according to other example embodiments of the present inventive concepts includes a first semiconductor substrate 100, a first alignment mark AM1, a second semiconductor substrate 200, a second alignment mark AM2, a third alignment mark AM3, and bonding bumps 310, 320, and 330.

The first semiconductor substrate 100, the first alignment mark AM1, the second semiconductor substrate 200, the second alignment mark AM2, and the bonding bumps 310, 320, and 330 are substantially the same as those as described above.

The third alignment mark AM3 may be formed on a side 102 of the first semiconductor substrate 100. In this case, the third alignment mark AM3 may be formed in a position that corresponds to the first alignment mark AM1.

That is, the third alignment mark AM3 may be formed to easily grasp the shape and the position of the first alignment mark AM1 in the subsequent process.

FIG. 8 illustrates the position in which the third alignment mark AM3 is formed. The third alignment mark AM3 may be formed so that the outline of the third alignment mark AM3 is positioned within a range of about 3.75 μm from the outline that corresponds to the first alignment mark AM1.

When the first alignment mark AM1 that is formed through the laser process is recognized from an outside, the error range of a recognition region AM_R is about 3.75 μm. This value is a value which is determined according to the results of experiments and indicates the error range in which the first alignment mark AM can be recognized in the backside alignment process.

Because the third alignment mark AM3 is formed on the side 102 of the first semiconductor substrate 100 that faces the second semiconductor substrate 200, it can be used as the alignment key in the subsequent process.

Figure 9:

FIG. 9 is a schematic cross-sectional view of a semiconductor device according to still other example embodiments of the present inventive concepts.

For convenience in explanation, the explanation of portions that are substantially the same as those of the semiconductor device according to example embodiments of the present inventive concepts shown in FIG. 4 as described above will be omitted.

Referring to FIG. 9, a semiconductor device 3 according to still other example embodiments of the present inventive concepts includes a semiconductor chip SC and a fourth alignment mark AM4.

In the semiconductor chip SC, a scribe line region SR and a chip region CR are defined. The semiconductor chip SC may be one of various integrated circuit (IC) chips that are used in a semiconductor product.

The semiconductor chip SC may include a semiconductor material as a semiconductor substrate. In particular, the semiconductor chip SC may include silicon (Si), but example embodiments of the present inventive concepts are not limited thereto. For example, the semiconductor chip SC may be made of at least one semiconductor material that is selected from the group including Si, Ge, SiGe, GaP, GaAs, SiGeC, InAs, and InP. Further, the semiconductor chip SC may be made of SOI (Silicon On Insulator).

The fourth alignment mark AM4 is formed inside the semiconductor chip SC of the scribe line region SR to be spaced apart from an upper side of the semiconductor chip SC. Further, the fourth alignment mark AM4 is formed inside the semiconductor chip SC of the scribe line region SR to be spaced apart from a lower side of the semiconductor chip SC.

Because the fourth alignment mark AM4 is formed inside the semiconductor chip SC of the scribe line region SR using a laser process, the fourth alignment mark AM4 can be formed without exerting an influence on the surface of the semiconductor chip SC. Forming of the fourth alignment mark AM4 is to make a part of the semiconductor chip SC in an amorphous state. Because the semiconductor material of the semiconductor chip SC exists in a crystalline state and the fourth alignment mark AM4 is in an amorphous state, the fourth alignment mark can be used as an alignment key due to the recognition difference in illumination and brightness between them in the subsequent process.

In a process of sawing the scribe line region SR, a part of the fourth alignment mark AM4 may be removed, but the fourth alignment mark AM4 that is formed adjacent to the chip region CR may remain without being removed. Accordingly, the fourth alignment mark can be used as the alignment key.

The alignment mark that is formed in the scribe line region of the wafer may be in a cross (+) shape. A part of the alignment mark is removed through the process of sawing the scribe line region, and the shape of the fourth alignment mark AM4 remains. However, in example embodiments of the present inventive concepts, the shape of the alignment mark is not limited thereto. The alignment mark may be in various shapes, such as "L", "H", and "U" shapes.

Figure 10:
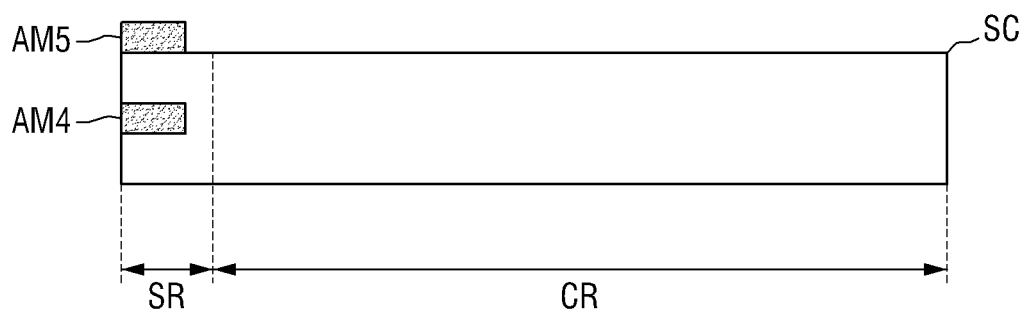

FIG. 10 is a schematic cross-sectional view of a semiconductor device according to still other example embodiments of the present inventive concepts.

For convenience in explanation, the explanation of portions that are substantially the same as those of the semiconductor device according to example embodiments of the present inventive concepts shown in FIG. 4 as described above will be omitted.

Referring to FIG. 10, a semiconductor device 4 according to still other example embodiments of the present inventive concepts includes a semiconductor chip SC, a fourth alignment mark AM4, and a fifth alignment mark AM5.

The semiconductor chip SC and the fourth alignment mark AM4 are substantially the same as those as described above.

The fifth alignment mark AM5 may be formed on a side of the semiconductor chip SC, and particularly in a position that corresponds to the position in which the fourth alignment mark AM4 is formed. The fifth alignment mark AM5 may be formed to easily grasp the shape and the position of the fourth alignment mark AM4 in the subsequent process.

The fifth alignment mark AM5 may be formed so that the outline of the fifth alignment mark AM5 is positioned within a range of about 3.75 μm from the outline that corresponds to the fourth alignment mark AM4.

When the fifth alignment mark AM5 that is formed through the laser process is recognized from an outside, the error range of a recognition region is about 3.75 μm. This value is a value which is determined according to the results of experiments and indicates the error range in which the fifth alignment mark AM5 can be recognized in the backside alignment process.

Because the fifth alignment mark AM5 is formed on the upper side of the semiconductor chip SC, it can be used as the alignment key in the subsequent process.

Hereinafter, methods for fabricating a semiconductor device according to example embodiments of the present inventive concepts will be described.

Figure 11:
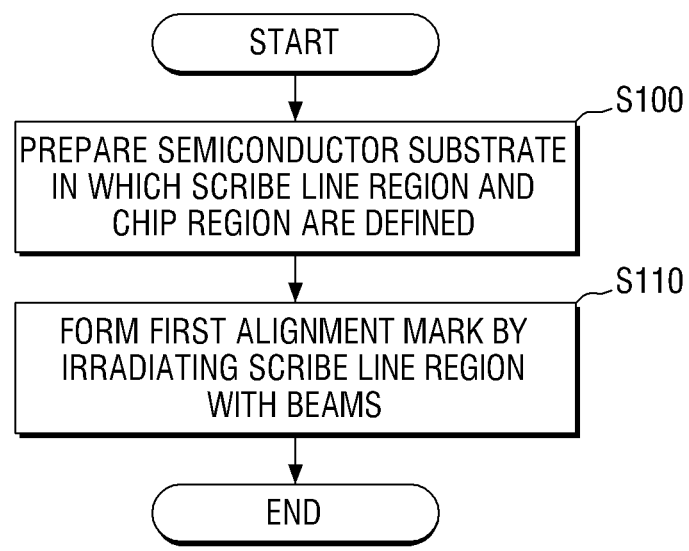

FIG. 11 is a flowchart sequentially illustrating a method for fabricating a semiconductor device according to example embodiments of the present inventive concepts.

Referring to FIG. 11 illustrating a method for fabricating a semiconductor device according to example embodiments of the present inventive concepts, a semiconductor substrate S, in which a scribe line region SR and a chip region CR are defined, is first prepared (S100).

The semiconductor substrate S may include silicon (Si), and for example, the semiconductor substrate S may be made of at least one semiconductor material that is selected from the group including Si, Ge, SiGe, GaP, GaAs, SiGeC, InAs, and InP. Further, the semiconductor substrate S may be made of SOI (Silicon On Insulator).

In a chip region CR of the semiconductor substrate S, for example, a through via structure or a circuit structure may be formed. That is, the semiconductor substrate S may be a semiconductor chip that is used in various kinds of semiconductor products. Here, the semiconductor chip may be an integrated circuit (IC) chip.

Then, by irradiating the scribe line region SR with beams, a first alignment mark AM1 is formed inside the semiconductor substrate S of the scribe line region SR to be spaced apart from an upper side or a lower side of the semiconductor substrate S (S110). Here, the beams may be laser beams.

Because the first alignment mark AM1 is formed inside the semiconductor substrate S of the scribe line region SR using the laser process, the first alignment mark AM1 can be formed without exerting an influence on the surface of the semiconductor substrate S.

Forming of the first alignment mark AM1 is to make a part of the semiconductor substrate S in an amorphous state. Because other portions of the semiconductor substrate S exist in a crystalline state and the first alignment mark AM1 is in an amorphous state, the first alignment mark can be used as an alignment key due to the recognition difference in illumination and brightness between them.

Particularly, in a process of sawing the scribe line region SR, a part of the first alignment mark AM1 may be removed, but the first alignment mark AM1 that is formed adjacent to the chip region CR may remain to be used as the alignment key without being removed.

The first alignment mark AM1 may be in a cross (+) shape, but example embodiments of the present inventive concepts are not limited thereto. The first alignment mark AM1 may be in various shapes, such as "L", "H", and "U" shapes.

Figure 12:
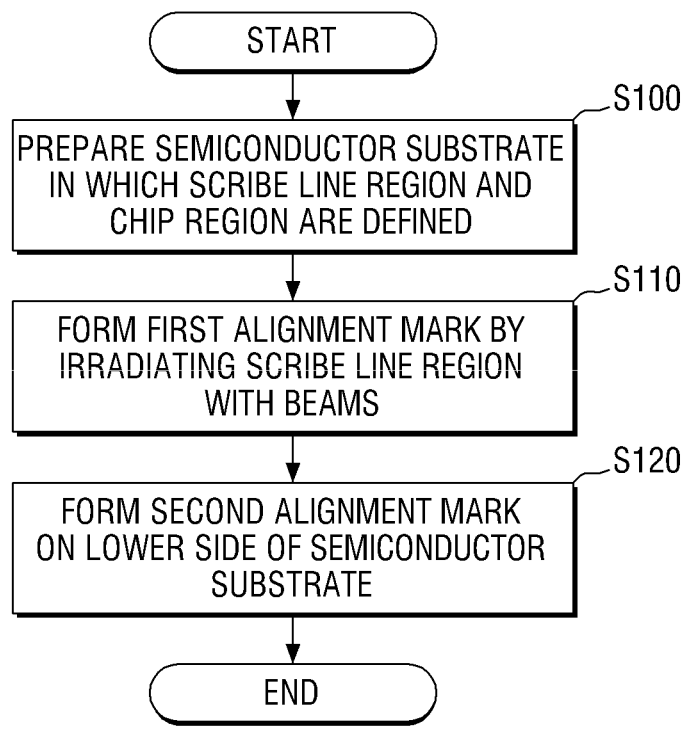

FIG. 12 is a flowchart sequentially illustrating a method for fabricating a semiconductor device according to other example embodiments of the present inventive concepts.

For convenience in explanation, the explanation of portions that are substantially the same as those in the method for fabricating a semiconductor device according to example embodiments of the present inventive concepts as described above will be omitted.

Referring to FIG. 12 illustrating a method for fabricating a semiconductor device according to other example embodiments of the present inventive concepts, a semiconductor substrate S, in which a scribe line region SR and a chip region CR are defined, is first prepared (S100). Then, by irradiating the scribe line region SR with beams, a first alignment mark AM1 is formed inside the semiconductor substrate S of the scribe line region SR to be spaced apart from an upper side or a lower side of the semiconductor substrate S (S110).

Then, a second alignment mark AM2 is formed on a lower side of the semiconductor substrate S, and particularly in a position that corresponds to the first alignment mark AM1 (S120).

The second alignment mark AM2 may be formed on the lower side of the semiconductor substrate S. After forming the first alignment mark AM1 inside the semiconductor substrate S, a backside grinding process may be performed, and the second alignment mark AM2 may be formed on the lower side of the semiconductor substrate S.

The second alignment mark AM2 may be formed in a position that corresponds to the first alignment mark AM1, and may be used to easily grasp the shape and the position of the first alignment mark AM1 in the subsequent process.

Figure 13:
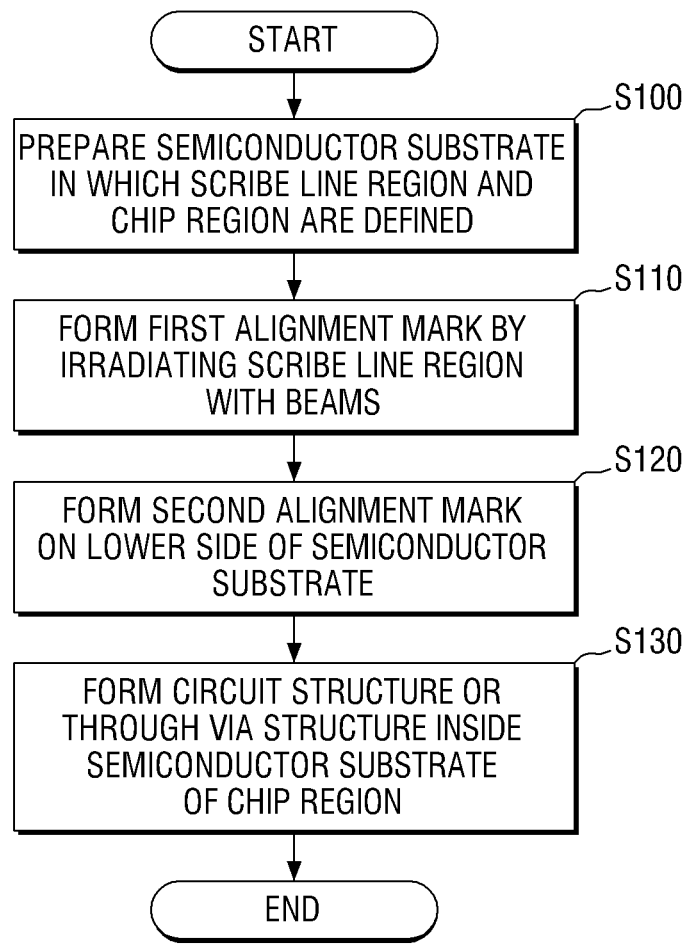

FIG. 13 is a flowchart sequentially illustrating a method for fabricating a semiconductor device according to still other example embodiments of the present inventive concepts.

For convenience in explanation, the explanation of portions that are substantially the same as those in the method for fabricating a semiconductor device according to example embodiments of the present inventive concepts as described above will be omitted.

Referring to FIG. 13 illustrating a method for fabricating a semiconductor device according to still other example embodiments of the present inventive concepts, a semiconductor substrate S, in which a scribe line region SR and a chip region CR are defined, is first prepared (S100). Then, by irradiating the scribe line region SR with beams, a first alignment mark AM1 is formed inside the semiconductor substrate S of the scribe line region SR to be spaced apart from an upper side or a lower side of the semiconductor substrate S (S110).

Then, a second alignment mark AM2 is formed on a lower side of the semiconductor substrate S, and particularly in a position that corresponds to the first alignment mark AM1 (S120).

Then, a circuit structure or a through via structure is formed inside the semiconductor substrate S of the chip region CR (S130).

The circuit structure that is formed inside the semiconductor substrate S may be used to perform the operation of the semiconductor chip, and the through via structure may be used to electrically connect other semiconductor chips in forming a semiconductor package.

The circuit structure or the through via structure may be formed according to the processing order, for example, before forming the first alignment mark AM1 or the second alignment mark AM2.

Figure 14:
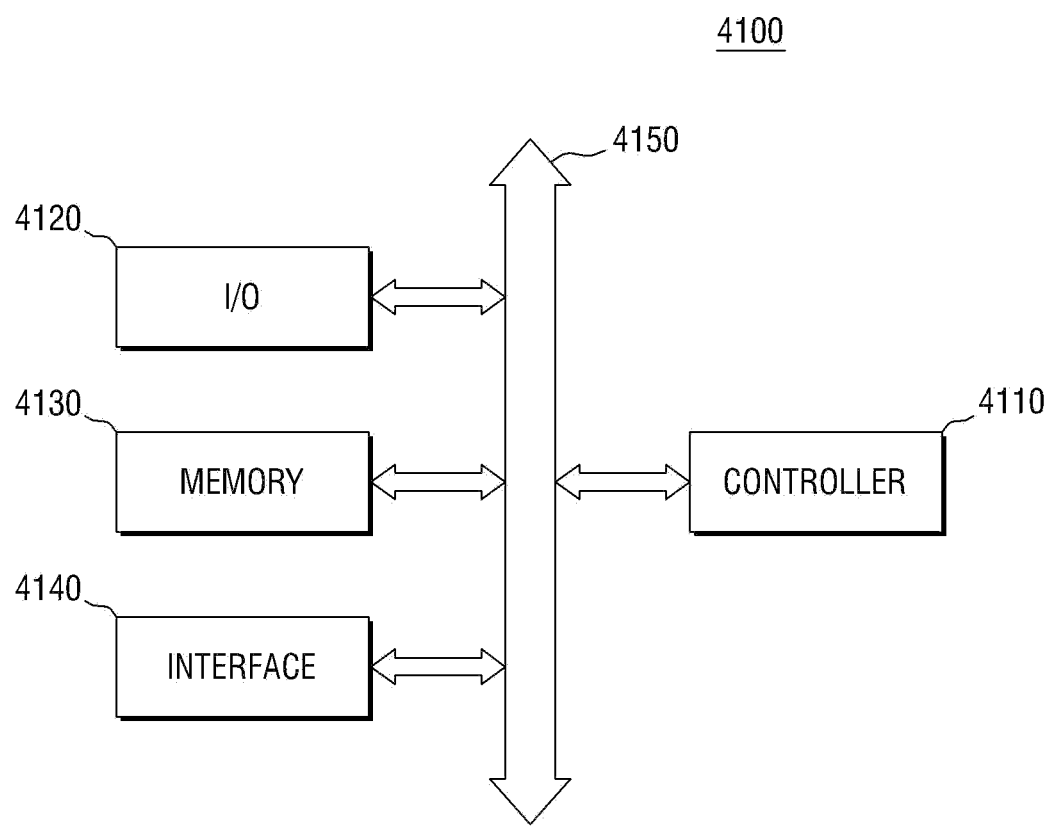

FIG. 14 is a block diagram of an electronic system including a semiconductor device according to some example embodiments of the present inventive concepts.

Referring to FIG. 14, an electronic system 4100 according to the example embodiments of the present inventive concepts may include a controller 4110, an input/output (I/O) device 4120, a memory 4130, an interface 4140, and a bus 4150.

The controller 4110, the I/O device 4120, the memory 4130, and/or the interface 4140 may be coupled to one another through the bus 4150. The bus 4150 corresponds to paths through which data is transferred.

The controller 4110 may include at least one of a microprocessor, a digital signal processor, a microcontroller, and logic elements that can perform similar functions.

The I/O device 4120 may include a keypad, a keyboard, and a display device.

The memory 4130 may store data and/or commands.

The interface 4140 may function to transfer the data to a communication network or receive the data from the communication network. The interface 4140 may be of a wired or wireless type. For example, the interface 4140 may include an antenna or a wire/wireless transceiver.

Although not illustrated, the electronic system 4100 may further include a high-speed DRAM and/or SRAM as an operating memory for improving the operation of the controller 4110. The semiconductor device according to example embodiments of the present inventive concepts may be provided inside the memory 4130 or may be provided as a part of the controller 4110 or the I/O device 4120.

The electronic system 4100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 15:
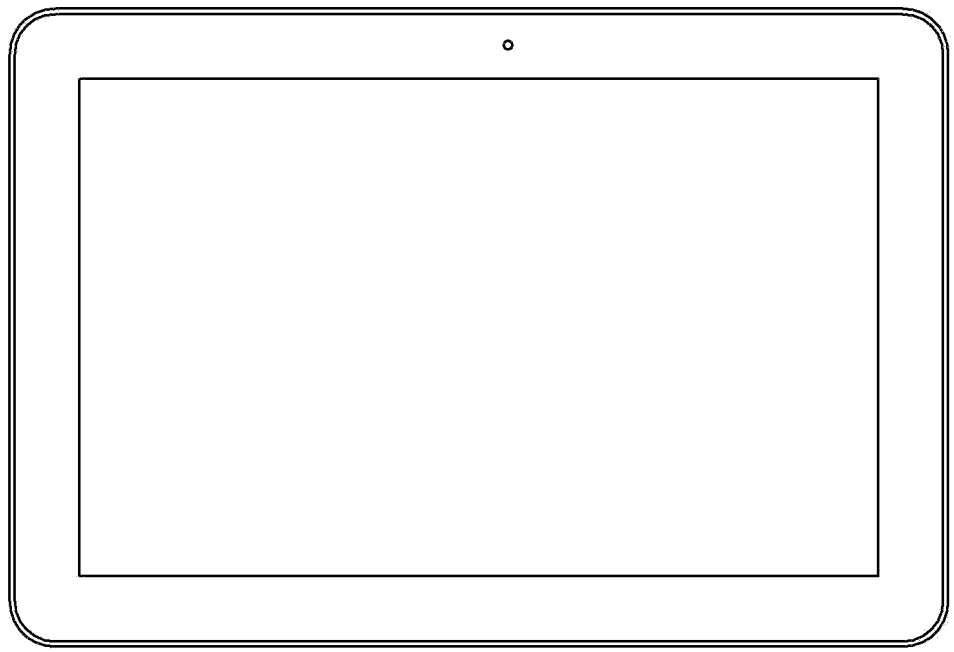
Figure 16:
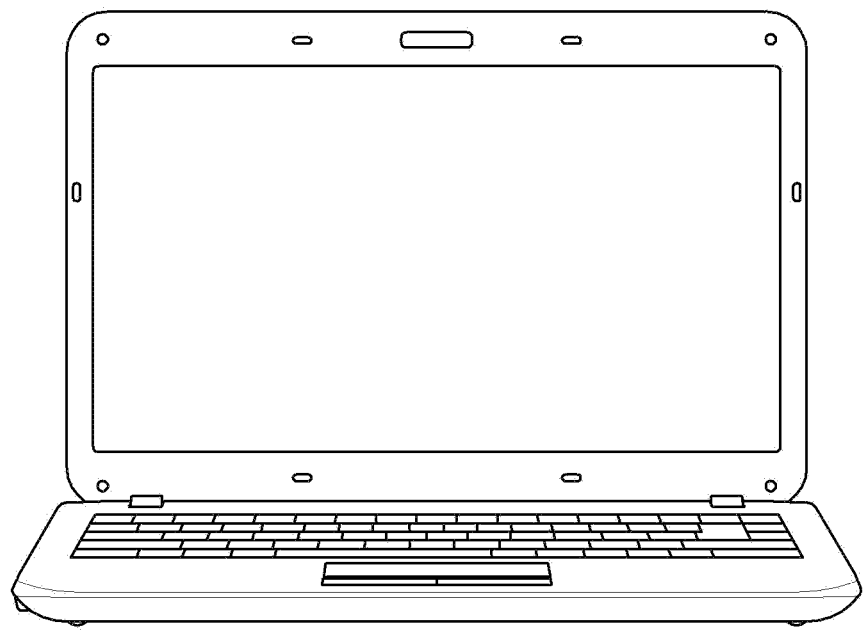

FIGS. 15 and 16 are plan and perspective views illustrating a semiconductor system to which a semiconductor device according to some example embodiments of the present inventive concepts can be applied.

FIG. 15 illustrates a tablet PC, and FIG. 16 illustrates a notebook PC. The semiconductor devices fabricated according to example embodiments of the present inventive concepts may be used in the tablet PC or the notebook PC. It is apparent to those of skilled in the art that the semiconductor device fabricated according to some example embodiments of the present inventive concepts can be applied even to other integrated circuit devices that have not been exemplified.

Although preferred example embodiments of the present inventive concepts have been described for illustrative purposes, those skilled in the art will appreciate that various modifications, additions and substitutions are possible, without departing from the scope and spirit of the disclosure as disclosed in the accompanying claims.

What is claimed is:

1. A semiconductor device, comprising:
a first semiconductor substrate in which a first scribe line region and a first chip region are defined;
a first alignment mark inside the first semiconductor substrate and in the first scribe line region so as to be spaced apart from an upper side of the first semiconductor substrate;
a second semiconductor substrate on the first semiconductor substrate and in which a second scribe line region and a second chip region are defined;
a second alignment mark inside the second semiconductor substrate and in the second scribe line region so as to be spaced apart from an upper side of the second semiconductor substrate and a lower side of the second semiconductor substrate; and
a through via structure inside the second chip region of the second semiconductor substrate,
wherein the second semiconductor substrate is on the first semiconductor substrate so that positions of the first alignment mark and the second alignment mark correspond to each other, and
wherein the second alignment mark overlaps laterally the through via structure in a direction that is parallel with respect to a major axis of the second semiconductor substrate.

2. The semiconductor device of claim 1, wherein the first and second semiconductor substrates include silicon.

3. The semiconductor device of claim 2, wherein the first and second alignment marks are in an amorphous state.

4. The semiconductor device of claim 3, wherein the first and second alignment marks are formed by respectively irradiating the first and second semiconductor substrates with a laser.

5. The semiconductor device of claim 1, further comprising:
a third alignment mark on a side of the first semiconductor substrate facing the second semiconductor substrate.

6. The semiconductor device of claim 5, wherein the third alignment mark is formed in a position that corresponds to the position of the first alignment mark.

7. The semiconductor device of claim 5, wherein an outline of the third alignment mark is positioned within and about 3.75 μm from an outline of the first alignment mark.

8. The semiconductor device of claim 1, further comprising:
a circuit structure inside the second chip region of the second semiconductor substrate.

9. The semiconductor device of claim 1, wherein the first alignment mark or the second alignment mark is shaped in a form of a cross.

10. A semiconductor device, comprising:
a semiconductor chip including a scribe line region;
a through via structure inside the semiconductor chip; and
a first alignment mark inside the semiconductor chip and in the scribe line region so as to be spaced apart from an upper side of the semiconductor chip and a lower side of the semiconductor chip,
wherein the first alignment mark overlaps laterally the through via structure in a direction that is parallel with respect to a major axis of the semiconductor chip.

11. The semiconductor device of claim 10, further comprising:
a second alignment mark in a position corresponding to a position of the first alignment mark and on a lower side of the semiconductor chip, wherein the lower side and the upper side oppose each other.

12. The semiconductor device of claim 11, wherein the semiconductor chip includes silicon.

13. The semiconductor device of claim 12, wherein the semiconductor chip is in a crystalline state, and the first alignment mark is in an amorphous state.

14. The semiconductor device of claim 11, wherein the first alignment mark is shaped in a form of a cross.

15. The semiconductor device of claim 5, wherein an outline of the second alignment mark is positioned within about 3.75 μm from an outline of the first alignment mark.

16. A semiconductor device, comprising:
a semiconductor layer including at least one scribe line region delimiting a side of at least one chip region;
a through via structure inside the semiconductor layer; and
an alignment mark within the semiconductor layer so as to be spaced apart from a first surface of the semiconductor layer on which semiconductor chips are formed and a second surface of the semiconductor layer, parallel to the first surface,
wherein the alignment mark and a portion of the through via structure are at a common distance from the first surface of the semiconductor layer.

17. The semiconductor device according to claim 16, wherein a solid state of the semiconductor layer is different than a solid state of the alignment mark.

18. The semiconductor device according to claim 17, wherein the solid state of the alignment mark is crystalline, polycrystalline or amorphous.

* * * * *